United States Patent
Sakai et al.

(10) Patent No.: US 9,756,728 B2
(45) Date of Patent: Sep. 5, 2017

(54) COMPONENT-MOUNTED STRUCTURE

(71) Applicant: PANASONIC INTELLECTUAL PROPERTY MANAGEMENT CO., LTD., Osaka (JP)

(72) Inventors: Tadahiko Sakai, Osaka (JP); Hideki Eifuku, Osaka (JP); Koji Motomura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 40 days.

(21) Appl. No.: 14/423,417

(22) PCT Filed: May 22, 2013

(86) PCT No.: PCT/JP2013/003258
§ 371 (c)(1),
(2) Date: Feb. 23, 2015

(87) PCT Pub. No.: WO2014/033983
PCT Pub. Date: Mar. 6, 2014

(65) Prior Publication Data
US 2015/0208509 A1 Jul. 23, 2015

(30) Foreign Application Priority Data

Aug. 31, 2012 (JP) ................................ 2012-192246

(51) Int. Cl.
*H05K 1/00* (2006.01)
*H05K 1/18* (2006.01)
(Continued)

(52) U.S. Cl.
CPC .............. *H05K 1/18* (2013.01); *H01L 24/29* (2013.01); *H01L 24/32* (2013.01); *H01L 24/83* (2013.01);
(Continued)

(58) Field of Classification Search
CPC .......... H02G 15/18; H02G 15/10; H01R 4/20; H05K 1/0263; H05K 1/0265;
(Continued)

(56) References Cited

U.S. PATENT DOCUMENTS 5,155,301 A * 10/1992 Mase ....................... H01R 4/04
174/117 FF
6,337,445 B1 * 1/2002 Abbott .............. H01L 23/49816
174/257

(Continued)

FOREIGN PATENT DOCUMENTS

CN    1656862 A    8/2005
CN    1723590 A    1/2006
(Continued)

OTHER PUBLICATIONS

JP 2005005630A English Translation hereinafter Murayama.*
(Continued)

*Primary Examiner* — Pete Lee
(74) *Attorney, Agent, or Firm* — McDermott Will & Emery LLP

(57) ABSTRACT

Disclosed is a component-mounted structure including a first object having a plurality of first electrodes, a second object as an electronic component having second electrodes, a joint portion joining the plurality of first electrodes and the corresponding second electrodes to each other, and a resin-reinforcing portion. The joint portion has a core including at least one of a first metal and a resin particle, and a layer of an intermetallic compound of the first metal and a second metal having a low melting point. The resin-reinforcing portion includes a particulate matter including the core and the intermetallic compound, in a portion except between the first and second electrodes. An amount of the particulate matter included in the portion is 0.1 to 10 vol %.

15 Claims, 10 Drawing Sheets

(51) Int. Cl.
*H05K 3/32* (2006.01)
*H01L 23/00* (2006.01)
*H05K 1/03* (2006.01)
*H05K 1/14* (2006.01)
*H05K 3/34* (2006.01)

(52) U.S. Cl.
CPC .......... *H05K 1/0373* (2013.01); *H05K 1/147* (2013.01); *H05K 3/323* (2013.01); *H01L 2224/293* (2013.01); *H01L 2224/294* (2013.01); *H01L 2224/2929* (2013.01); *H01L 2224/2939* (2013.01); *H01L 2224/29499* (2013.01); *H01L 2224/32225* (2013.01); *H01L 2224/81193* (2013.01); *H01L 2224/81903* (2013.01); *H01L 2224/8385* (2013.01); *H01L 2224/83192* (2013.01); *H01L 2224/9211* (2013.01); *H01L 2924/351* (2013.01); *H05K 3/3436* (2013.01); *H05K 2201/0209* (2013.01); *H05K 2201/0218* (2013.01); *H05K 2201/0221* (2013.01); *H05K 2201/0233* (2013.01); *H05K 2203/0278* (2013.01); *H05K 2203/0425* (2013.01); *H05K 2203/0465* (2013.01)

(58) Field of Classification Search
CPC .. H05K 1/0284; H05K 1/0296; H05K 1/0298; H05K 1/036; H05K 1/0366; H05K 1/0373; H05K 1/05; H05K 1/111; H05K 1/114; H05K 1/117; H05K 1/119; H05K 1/142; H05K 2201/09872; H05K 2201/10378; H05K 3/46; H05K 1/053; H05K 1/056; H05K 2201/0738; H05K 1/09; H05K 1/092; H05K 1/095; H05K 1/097; H05K 2201/0133; H05K 2201/02; H05K 2201/0203; H05K 2201/0206; H05K 2201/0209; H05K 2201/0212; H05K 2201/0215; H05K 2201/0218; H05K 2201/0224; H05K 2201/0227; H05K 2201/023; H05K 2201/0233; H05K 2201/0236; H05K 2201/0239; H05K 2201/0272; H05K 2201/0323; H05K 2201/0326; H05K 2201/0329; H05K 2201/051; H05K 2201/0129; H05K 2201/0195; H05K 3/03; H05K 1/0231; H05K 1/0233; H05K 1/0234; H05K 1/0243; H05K 1/0295; H05K 1/141; H05K 1/144; H05K 1/145; H05K 1/16; H05K 1/162; H05K 1/165; H05K 1/167; H05K 1/181; H05K 1/182; H05K 1/183; H05K 1/184; H05K 1/185; H05K 2201/041; H05K 2201/049; H05K 2201/09763; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/341; H05K 3/3415; H05K 3/3421; H05K 3/3431; H05K 3/36; H05K 1/0215

USPC .................. 257/778; 174/88 R; 438/616
See application file for complete search history.

(56) References Cited

U.S. PATENT DOCUMENTS

| | | | |
|---|---|---|---|
| 6,906,427 B2 * | 6/2005 | Tanaka | C23C 18/1619 252/513 |
| 7,327,039 B2 * | 2/2008 | Charles | H01L 21/563 257/778 |
| 8,043,709 B2 | 10/2011 | Arifuku et al. | |
| 8,273,207 B2 * | 9/2012 | Ishimatsu | C09J 9/02 156/276 |
| 8,519,549 B2 * | 8/2013 | Lee | C09J 7/02 257/783 |
| 2002/0100986 A1 | 8/2002 | Soga et al. | |
| 2002/0114726 A1 | 8/2002 | Soga et al. | |
| 2002/0171157 A1 | 11/2002 | Soga et al. | |
| 2006/0100314 A1 * | 5/2006 | Arifuku | C09J 9/02 523/210 |
| 2007/0031279 A1 | 2/2007 | Soga et al. | |
| 2009/0256256 A1 * | 10/2009 | Meyer | H01L 24/13 257/738 |
| 2009/0291314 A1 | 11/2009 | Sakai et al. | |
| 2013/0168851 A1 * | 7/2013 | Lin | H01L 24/11 257/737 |

FOREIGN PATENT DOCUMENTS

| | | |
|---|---|---|
| JP | 11-219982 A | 8/1999 |
| JP | 2002-261105 A | 9/2002 |
| JP | 2006-108523 A | 4/2006 |
| JP | 2008-069319 A | 3/2008 |
| JP | 2008-251522 A | 10/2008 |
| JP | 2011-187635 A | 9/2011 |
| JP | 2012-151105 A | 8/2012 |
| WO | 2008-032870 A2 | 3/2008 |

OTHER PUBLICATIONS

JP 2005005630A English Translation.*
Murayama et al. (JP 2005005630 A Abstract English Translation).*
International Search Report issued in International Application No. PCT/JP2013/003258 with Date of mailing Jul. 23, 2013, with English Translation.
Chinese Office Action and Search Report issued in corresponding Chinese Patent Application No. 201380044722.0, mailed on Nov. 18, 2016; with partial English translation.

* cited by examiner

COMPONENT-MOUNTED STRUCTURE

RELATED APPLICATIONS

This application is a national phase of International Application No. PCT/JP2013/003258, filed on May 22, 2013, which in turn claims the benefit of Japanese Application No. 2012-192246, filed on Aug. 31, 2012 the disclosures of which Applications are incorporated by reference herein.

TECHNICAL FIELD

The present invention relates to a component-mounted structure including a first object and a second object as an electronic component.

BACKGROUND ART

Conventional component-mounted structures are composed of electronic components such as a semiconductor chip, and a substrate such as a printed circuit board. The electronic component and the circuit board are electrically and mechanically connected together by solder-joining their electrodes to each other. However, the purpose of solder joining is mainly to achieve electrical connection between the electrodes, and the mechanical connection strength therebetween is lower than that obtained by, for example, welding. Therefore, conventionally, an adhesive containing a thermosetting resin is supplied between the electronic component and the circuit board to form a resin-reinforcing portion, thereby to reinforce the solder joint portion.

In such a case, a paste prepared by mixing a solder powder with the adhesive (hereinafter referred to as "solder-resin mixture") is sometimes supplied between the corresponding electrodes of the electronic component and the circuit board (see, e.g., Patent Literature 1). Thus, the solder-joining of the electrodes and the resin-reinforcing of the solder joint portion using the adhesive can be simultaneously performed. In Patent Literature 1, the melting temperature of the solder powder is set lower than the glass transition temperature of the thermosetting resin, thereby to suppress the thermal stress acting on the joint interface between the resin-reinforcing portion and the electronic component or the circuit board.

However, when a solder having a comparatively low melting point is used to join the electrode terminals as in Patent Literature 1, if a reheating process such as re-flowing is further performed after the electronic component is joined to the circuit board, the solder joint portion will easily melt again. This may reduce the connection reliability between the electronic component and the circuit board.

To avoid this, Patent Literature 2 proposes to add metal particles with high melting point, such as Cu particles, to the solder-resin mixture, to form an intermetallic compound of solder and Cu, and thereby to raise the re-melting temperature of the solder joint portion.

CITATION LIST

Patent Literature

[PTL 1] Japanese Laid-Open Patent Publication No. 2008-69316
[PTL 2] Japanese Laid-Open Patent Publication No. 2002-261105

SUMMARY OF INVENTION

Technical Problem

However, in order to raise the re-melting temperature of the solder joint portion sufficiently by forming an intermetallic compound of solder and Cu, it is necessary to increase the contact area between the Cu particles and the solder, and in order to increase the contact area, it is necessary to include a comparatively large amount of Cu particles in the solder-resin mixture.

As illustrated in FIG. 17, in joining electrodes 16A of an electronic component 12A to corresponding electrodes 18A of a circuit board 14A by thermocompression bonding, the electronic component and the circuit board are pressed against each other at a specific pressure so as to bring the corresponding electrodes into contact with each other. Accordingly, in solder-joining by thermocompression bonding, the space for holding a molten solder 49, i.e., a solder 48 melted, between the electrodes becomes small. Because of this, when Cu particles 46 are included in the solder-resin mixture, the molten solder 49 having overflowed the space between the electrodes may spread via the Cu particles 46 to the adjacent electrodes. As a result, if the distance between the adjacent electrodes is small, a short circuit may occur between those electrodes, and the connection reliability between the electronic component and the circuit board may be reduced.

In view of the above, an objective of the present invention is to provide a component-mounted structure having an electronic component connected to a circuit board in which their electrodes are joined to each other by thermocompression bonding using a solder having a comparatively low melting point, and yet in which a joint portion having a sufficiently high re-melting temperature can be formed, a short circuit between adjacent electrodes can be prevented, and the connection reliability between the electronic component and the circuit board can be improved.

Solution to Problem

A component-mounted structure of the present invention includes:
a first object having a plurality of first electrodes,
a second object as an electronic component, the second object having second electrodes respectively corresponding to the plurality of first electrodes,
a joint portion joining the first electrodes and the corresponding second electrodes to each other, and
a resin-reinforcing portion covering at least part of the joint portion.

The joint portion has a first core and a first intermetallic compound layer covering a surface of the first core. The first core includes at least one of a first metal and a resin particle, and the first intermetallic compound layer includes an intermetallic compound of the first metal and a second metal having a melting point lower than the first metal.

The resin-reinforcing portion has a first portion existing between the first electrodes and the second electrodes, and a second portion other than the first portion.

The second portion includes a particulate matter having a second core and a second intermetallic compound layer. The second core includes at least one of the first metal and the resin particle, and the second intermetallic compound layer includes the intermetallic compound of the first metal and the second metal.

An amount of the particulate matter included in the second portion is 0.1 to 10 vol %.

Advantageous Effects of Invention

According to the present invention, even when a component-mounted structure is produced by joining the electrodes of an electronic component and the electrodes of a circuit board to each other by thermocompression bonding using a solder having a comparatively low melting point, a joint portion having a sufficiently high re-melting temperature can be formed, and a short circuit between adjacent electrodes can be prevented, whereby the connection reliability between the electronic component and the circuit board can be improved.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
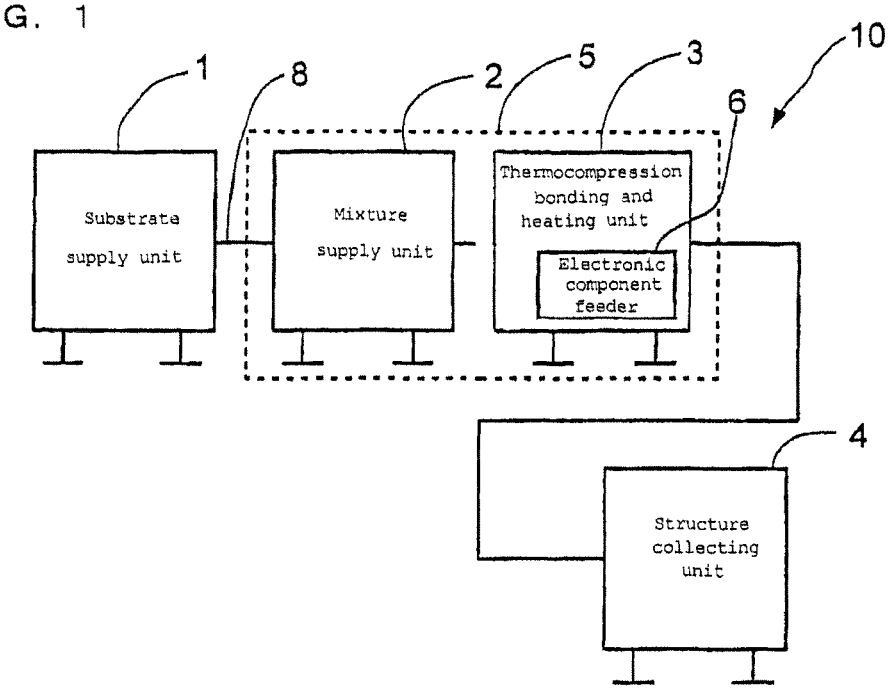
[FIG. 1] A block diagram schematically illustrating a component-mounting system according to one embodiment of the present invention.

The present invention relates to a component-mounted structure including: a first object having a plurality of first electrodes; a second object as an electronic component, the second object having second electrodes respectively corresponding to the plurality of first electrodes; a joint portion joining the first electrodes and the corresponding second electrodes to each other; and a resin-reinforcing portion covering at least part of the joint portion.

The joint portion has a first core and a first intermetallic compound layer covering a surface of the first core. The first core includes at least one of a first metal and a resin particle, and the first intermetallic compound layer includes an intermetallic compound of the first metal and a second metal having a melting point lower than the first metal. The resin-reinforcing portion has a first portion existing between the first electrodes and the second electrodes, and a second portion other than the first portion. The second portion includes a particulate matter having a second core and a second intermetallic compound layer. The second core includes at least one of the first metal and the resin particle, and the second intermetallic compound layer includes the intermetallic compound of the first metal and the second metal. An amount of the particulate matter included in the second portion is 0.1 to 10 vol %. More preferably, the amount is 0.1 to 5 vol %. The electronic component includes, for example, an IC chip (bare chip), a package, an electronic component module, a chip component, and other various electronic components.

The component-mounted structure configured as above can be produced by a component-mounting method as below.

For example, the method includes the steps of: (a) preparing a first object having a plurality of electrodes; (b) preparing a second object as an electronic component, the second object having second electrodes respectively corresponding to the plurality of first electrodes; (c) supplying a solder-resin mixture including a particulate matter precursor and a thermosetting resin onto the first electrodes, the particulate matter precursor having a core (third core) and a solder layer (third solder layer) covering a surface of the core, the core including a first metal or including a first metal and a resin particle, the solder layer including a second metal having a melting point lower than the first metal, the first metal being in contact with the solder layer, the first metal and the second metal being configured to form an intermetallic compound; (d) placing the second object onto the first object so that the plurality of second electrodes land on the corresponding first electrodes with the solder-resin mixture therebetween; (e) joining the plurality of second electrodes to the corresponding first electrodes by thermocompression bonding, to form a joint portion including the first metal and the second metal; and (f) heating the joint portion, thereby to accelerate the formation of the intermetallic compound through inter-diffusion of the first metal and the second metal in the joint portion, as well as to cure the thermosetting resin.

Here, the solder-resin mixture may be in the form of paste or film or in a semi-cured state (B stage). A first intermetallic compound layer and a second intermetallic compound layer are formed through heating for thermocompression bonding of the first and second electrodes and heating for accelerating the formation of the intermetallic compound in the joint portion. By allowing the solder-resin mixture to contain the particulate matter precursor in an amount of 0.1 to 10 vol %, the amount of the particulate matter included in the second portion of the resin-reinforcing portion can be 0.1 to 10 vol %. This is because the volume of the solder-resin mixture remains almost unchanged before and after joining of the first object and the second object.

The component-mounted structure configured as above can be produced by a component-mounting system as below.

An example of the system includes: a holding unit for holding a first object having a plurality of first electrodes; a mixture supply unit for supplying a solder-resin mixture including a particulate matter precursor and a thermosetting resin onto the first electrodes, the particulate matter precursor having a core (third core) and a solder layer (third solder layer) covering a surface of the core, the core including a first metal or including a first metal and a resin particle, the solder layer including a second metal having a melting point lower than the first metal, the first metal being in contact with the solder layer, the first metal and the second metal being configured to form an intermetallic compound; and a placement unit configured to hold a second object as an electronic component, the second object having a plurality of second electrodes respectively corresponding to the plurality of first electrodes, and place the second object on the first object so that the plurality of second electrodes land on the corresponding first electrodes with the solder-resin mixture therebetween. The placement unit presses the second object against the first object and heats the second object, thereby to join the second electrodes to the corresponding first electrodes by thermocompression bonding, to form a joint portion including the first metal and the second metal; and further heats the joint portion, thereby to accelerate the formation of the intermetallic compound through inter-diffusion of the first metal and the second metal in the joint portion, as well as to cure the thermosetting resin.

Another example of the system includes: a holding unit for holding a first object having a plurality of first electrodes; a mixture supply unit for supplying a solder-resin mixture including a particulate matter precursor and a thermosetting resin onto the first electrodes, the particulate matter precursor having a core (third core) and a solder layer (third solder layer) covering a surface of the core, the core including a first metal or including a first metal and a resin particle, the solder layer including a second metal having a melting point lower than the first metal, the first metal being in contact with the solder layer, the first metal and the second metal being configured to form an intermetallic compound; a placement unit configured to hold a second object as an electronic component, the second object having a plurality of second electrodes respectively corresponding to the plurality of first electrodes, place the second object on the first object so that the plurality of second electrodes land on the corresponding first electrodes with the solder-resin mixture therebetween, and press the second object against the first object and heat the second object, thereby to join the second electrodes to the corresponding first electrodes by thermocompression bonding, to form a joint portion including the first metal and the second metal; and a post-heating unit configured to enclose or hold the second object placed on the first object and further heat the joint portion, thereby to accelerate the formation of the intermetallic compound through inter-diffusion of the first metal and the second metal in the joint portion, as well as to cure the thermosetting resin.

Figure 4:
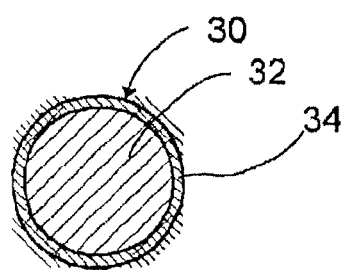
[FIG. 4] A cross-sectional view of a particulate matter to be included in a solder-resin mixture.
Figure 11A:
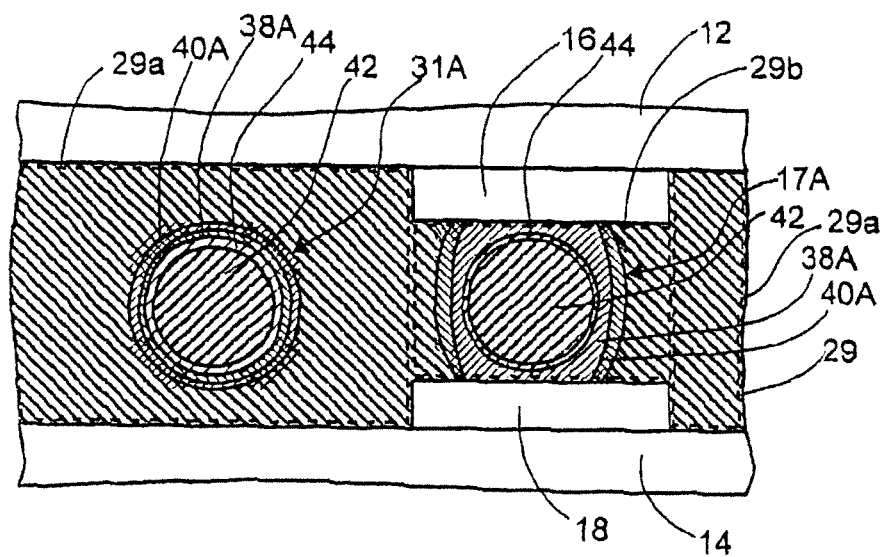
[FIG. 11A] A partial cross-sectional view of an essential part of a component-mounted structure according to another embodiment of the present invention.
Figure 11B:
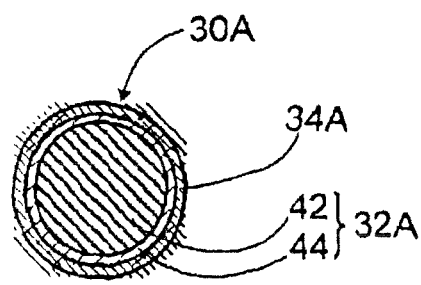
[FIG. 11B] A cross-sectional view of a particulate matter to be included in the solder-resin mixture used in producing the component-mounted structure of FIG. 11A.

In the component-mounting method and system as above, the particulate matter precursor contained in the solder-resin mixture includes: a core (third core) including a first metal; and a solder layer (third solder layer) including a second metal (solder or a solder alloy) and covering the surface of the core while being in contact with the first metal (see FIGS. 4 and 11B). As a result, for example, by distributing the first metal at the surface of the core, the contact area between the first metal and the second metal can be increased, and a larger amount of intermetallic compound of the first metal having a comparatively high melting point and the second metal can be formed at the joint portion. In that way, the re-melting temperature of the joint portion can be easily raised to be higher than the melting point of the original second metal, and the connection reliability between the electronic component and the substrate can be improved.

Figure 17:
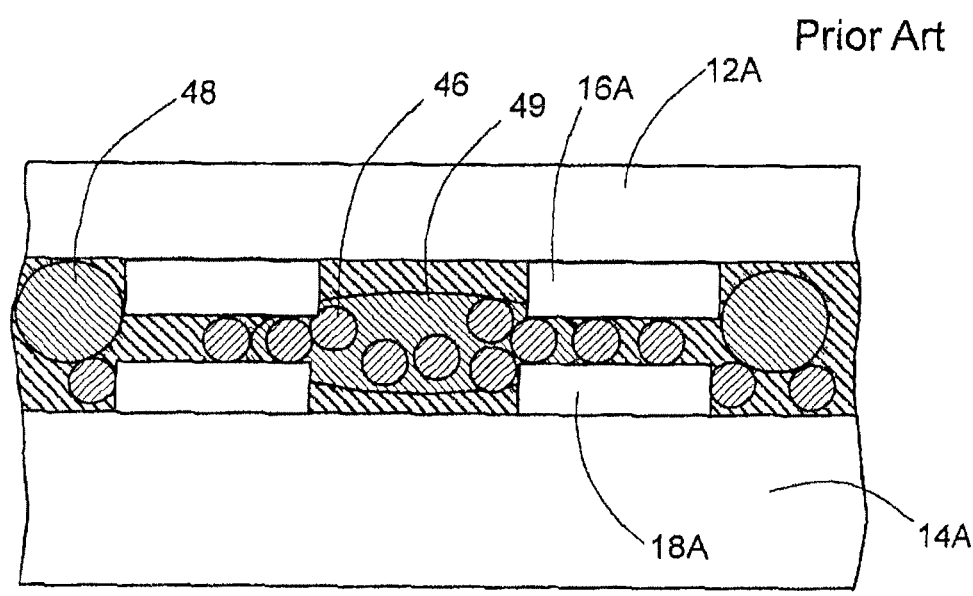
[FIG. 17] An enlarged partial cross-sectional view of a conventional component-mounted structure for explaining a problem of conventional component-mounted structures produced by conventional component-mounting system and method.

As a result of the foregoing, as compared with when, for example, the particles (46) of the first metal are simply included in the solder-resin mixture as in FIG. 17, a sufficient amount of intermetallic compound can be formed, which can reduce the amount of the first metal particles required for raising the re-melting temperature of the joint portion to a desired temperature. Therefore, it is unlikely to happen that the molten solder (49) having overflowed the space between the corresponding electrodes spreads to the adjacent electrodes via the first metal particles (46) existing in a large amount. Thus a short circuit between adjacent electrodes can be prevented, and the connection reliability between the electronic component and the substrate can be improved.

Furthermore, the solder is included in the solder layer present on the surface of the particulate matter precursor. Therefore, the amount of solder supplied can be easily reduced to a necessary and sufficient level. Due to the inclusion of the first metal having a comparatively high melting point in the core of the particulate matter precursor, the core of the particulate matter precursor sandwiched between the corresponding electrodes may keep its original shape while those electrodes undergo thermocompression. As a result, the corresponding electrodes are joined to each other by thermocompression bonding with a certain gap ensured therebetween, and the amount of solder to overflow the space between the corresponding electrodes can be reduced. Therefore, a short circuit between adjacent electrodes can be effectively prevented.

The amount of the particulate matter included in the second portion of the resin-reinforcing portion is 0.1 to 10 vol %. By setting the lower limit of the amount to 0.1 vol %, the lower limit of the amount of the particulate matter included in the solder-resin mixture is also set to 0.1 vol %. This can suppress the occurrence of conductive failure. On the other hand, by setting the upper limit of the amount of the particulate matter precursor to 10 vol %, a short circuit between adjacent electrodes can be effectively prevented.

As described above, in the component-mounted structure of the present invention, since the joint portion includes a layer of intermetallic compound whose re-melting temperature is higher than the melting point of the original second metal, i.e., solder, the joint portion is unlikely to be broken when the component-mounted structure is further heated, and the connection reliability between the electronic component and the substrate can be improved. Moreover, since the amount of the particulate matter is set within the rage of 0.1 to 10 vol %, a conductive failure and a short circuit between adjacent electrodes can be prevented, and the connection reliability between the electronic component and the substrate can be improved.

As clear from the above, in the present invention, the core (second core) of the particulate matter has three embodiments: first, an embodiment mainly including the first metal only; secondly, including both the resin particle and the first metal; and thirdly, including the resin particle only. The core of the particulate matter of the first embodiment is formed typically when the core of the particulate matter precursor mainly includes the first metal only. The core of the particulate matter of the second and third embodiments is formed typically when the core of the particulate matter precursor includes the resin particle and a layer of the first metal covering the surface thereof. As for the core of the particulate matter of the third embodiment, all the first metal included in the core of the particulate matter precursor has been converted into an intermetallic compound, and no first metal remains in the core.

In other words, the joint portion may include a first solder layer including the second metal and covering a surface of the first intermetallic compound layer. The particulate matter may include a second solder layer including the second metal and covering a surface of the second intermetallic compound layer. The first metal may be present between the resin particle and the first solder layer. The first metal may be present between the resin particle and the second solder layer.

By including a resin particle in the core (third core) of the particulate matter precursor, the core becomes resistant to crushing when the corresponding electrodes are joined to each other by thermocompression bonding. This makes it easy to ensure a desired gap between the corresponding electrodes, and thus to ensure, for example, a signal transmission line length as designed. Furthermore, the cost can be lowered by using an inexpensive material for the resin particle. Preferably, the core of the particulate matter precursor includes a resin particle at its center, and the surface of the resin particle is entirely covered with a layer of the first metal. This can maximize the contact area between the first metal and the solder layer even though the amount of the first metal is reduced. Therefore, the re-melting temperature of the joint portion can be sufficiently raised. In the core of the particulate matter precursor, the entire surface of the resin particle may not be necessarily covered with the first metal layer, and a part of the surface of the resin particle may be directly in contact with the solder layer.

The particulate matter and the particulate matter precursor preferably have an average particle size (particle diameter at 50% cumulative volume in volumetric particle size distribution, the same is applied hereinafter) of 2 to 100 μm. The solder layer (third solder layer) of the particulate matter precursor preferably has a thickness of 0.1 to 10 μm. When the average particle size of the particulate matter precursor and the thickness of the solder layer are within the range above, almost all the solder included in the joint portion can be easily converted into an intermetallic compound because the thickness of the solder layer is comparatively thin. As a result, the re-melting temperature of the joint portion can be easily raised sufficiently. Furthermore, by setting as above, a certain gap can be easily ensured between the corresponding electrodes, and the amount of supplied solder can be reduced. Therefore, a short circuit between adjacent electrodes can be more effectively prevented.

The first metal preferably includes Cu. More specifically, the first metal may be a Cu alloy, and preferably has a melting point of 1000° C. or more. The second metal is an alloy which forms a solder, and preferably includes at least one selected from the group consisting of Sn, Pb, Ag, Zn, Bi, In, Cu, and Sb. The second metal preferably has a melting point of 110 to 240° C. A preferable heating temperature in thermocompression bonding is 60 to 250° C. A more preferable heating temperature in thermocompression bonding is 120 to 250° C.

In another embodiment of the present invention, the resin-reinforcing portion further includes an inorganic filler, such as silica ($SiO_2$) and alumina, which is smaller in average particle size than the particulate matter. By including an inorganic filler in, for example, the solder-resin mixture, a resin-reinforcing portion including the inorganic filler can be formed. This can lower the coefficient of thermal expansion of the resin-reinforcing portion, while increasing the modulus of elasticity thereof. Therefore, the deterioration of the resin-reinforcing portion such as cracks can be suppressed even though the component-mounted structure undergoes a heat cycle in which the component-mounted structure is heated and then cooled, or even though an impact due to the drop of the electronic component is applied to the resin-reinforcing portion. As a result, the resistance against heat cycle and the impact resistance of the joint portion can be improved. Moreover, the moisture absorptivity of the resin-reinforcing portion can be lowered, and thus the corrosion of the electrodes and wires can be prevented.

In the component-mounted structure of the present invention, the first object and the second object may both include a flexible substrate; the second object may include a flexible substrate, and the first object may include a rigid substrate; the second object may include a semiconductor chip, and the first object may include a flexible substrate or a rigid substrate; and the first object and the second object may both include a semiconductor chip.

Embodiment 1

Figure 2:
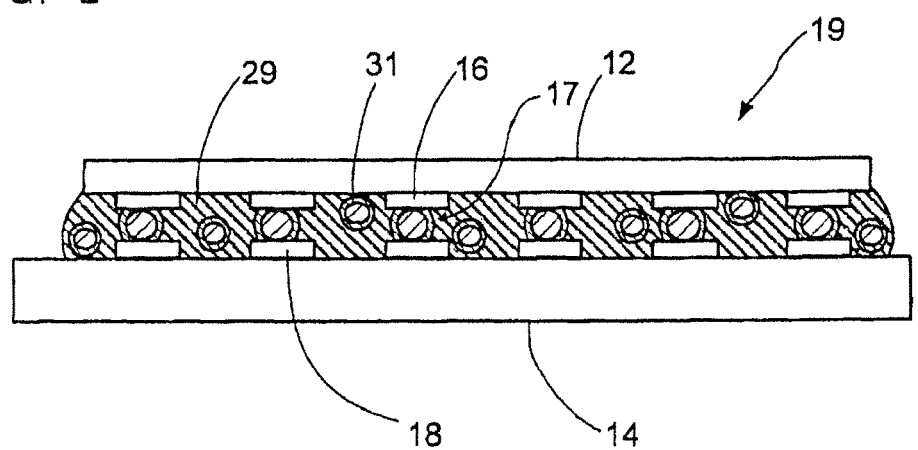
[FIG. 2] A cross-sectional view of an example of a component-mounted structure produced by a component-mounting system and a component-mounting method of the present invention.

FIG. 1 is a block diagram of a surface mount line, an example of a component-mounting system, for producing a component-mounted structure according to one embodiment of the present invention. FIG. 2 is a cross-sectional view of a component-mounted structure according to one embodiment of the present invention.

A line 10 of FIG. 1 is a system for mounting an electronic component (second object) onto a substrate (example of first object), such as a circuit board of an electronic device. The substrate may be a rigid substrate or a flexible substrate. Whichever the substrate is, the substrate can be transported independently one by one, or in an integrated form of a plurality of substrates, from one unit to another on the line 10. For example, when the substrate is a flexible substrate, the substrate can be transported independently one by one, for example, on a carrier board, or in the form of a tape-shaped material including a plurality of substrates, from one unit to another on the line 10. A tape-shaped material including a plurality of substrates can be transported from one unit to another on the line 10 by using, for example, a sprocket.

The electronic component may be a semiconductor chip (bare chip), or a package or module in which a component such as a semiconductor chip is mounted on a flexible or rigid substrate. The electronic component may be a chip component such as a passive element.

The line 10 illustrated in the figure is a surface mount line for mounting an electronic component 12, which is a module including a flexible substrate with a component such as a semiconductor chip mounted thereon, onto a rigid or flexible substrate 14 corresponding to a printed circuit board of an electronic device. More specifically, the line 10 includes a substrate supply unit 1, a mixture supply unit 2, a thermocompression-bonding and heating unit 3 including an electronic component feeder 6, and a structure collecting unit 4.

The substrate supply unit 1 supplies the substrate 14 onto the line. The mixture supply unit 2 supplies a solder-resin mixture onto land electrodes 18 serving as electrodes of the substrate 14. The thermocompression-bonding and heating unit 3 forms a joint portion 17 so as to join a plurality of component electrodes 16 of the electronic component 12 fed by the electronic component feeder 6 to the corresponding plurality of land electrodes 18 of the substrate 14 by thermocompression bonding (thermocompression bonding process). In addition, the thermocompression-bonding and heating unit 3 heats the joint portion 17 for the purpose of accelerating the rise in the re-melting temperature of the joint portion 17 (melting point shift acceleration process). Concurrently therewith, the thermocompression-bonding and heating unit 3 heats the solder-resin mixture, thereby to form a resin-reinforcing portion 29 so as to reinforce the joint portion 17 (resin curing process). The structure collecting unit 4 collects a component-mounted structure in which the electronic component 12 has been mounted on the substrate 14.

In a practical machine, the mixture supply unit 2 and the thermocompression-bonding and heating unit 3 can be integrated into one as a device bonder (die bonder or flip-chip bonder) 5. The line 10 further includes a conveyor 8 for transporting the substrate 14 from one unit to another.

The line 10 can be a surface mount line employing a carrier transport system in which the substrate 14 is loaded on a carrier board, and the carrier board is transported from one unit to another by the conveyor 8. The substrate 14 can be fixed onto the carrier board with a heat-resistant tape. Alternatively, the substrate 14 can be fixed by applying a low-stickiness type adhesive material onto a surface of the carrier board to face the substrate 14. In the latter case, the backside of the substrate 14 is entirely fixed onto the carrier board. Therefore, even when the substrate 14 is a flexible substrate, variations in height of the substrate 14 due to waving or the like can be reduced. When being a rigid substrate, the substrate 14 can be directly loaded on the conveyor 8 without using a carrier board.

The substrate supply unit 1 can be, for example, a magazine-type substrate loader. The structure collecting unit 4 can be, for example, a magazine-type substrate unloader. When using a tape-shaped material including the plurality of substrates 14, the substrate supply unit 1 can include a supply roll, and the structure collecting unit 4 can include a take-up roll.

When the solder-resin mixture is in the form of paste, the mixture supply unit 2 can include an application head (not shown) for supplying the solder-resin mixture by applying it onto the land electrodes 18 of the substrate 14 through a nozzle or the like, a dispenser (not shown) for providing the solder-resin mixture to the application head, a substrate recognition camera (not shown), and a controller (not shown). The controller controls the motion and operation of the application head, and the operation of the dispenser. The controller can include an image processor for processing images taken by the substrate recognition camera. Alternatively, the mixture supply unit 2 can include, in place of the application head, a printing machine such as a screen printer and an ink jet applicator. The solder-resin mixture can be supplied onto the land electrodes 18 of the substrate 14 by using these printing machines.

When the solder-resin mixture is in the form of film, the solder-resin mixture can be supplied onto the land electrodes 18 of the substrate 14 by picking up the solder-resin mixture from a separator (release paper) with a suction nozzle or the like, or transferring the solder-resin mixture from the separator onto a mounting region AR1 on the substrate (see FIG. 5) by thermocompression. When the solder-resin mixture is in the B stage described hereinlater, the solder-resin mixture dissolved in a solvent can be printed or applied onto the mounting region AR1 in advance, and then heating, whereby the solder-resin mixture can be supplied onto the land electrodes 18 of the substrate 14.

The electronic component feeder 6 can include various feeders such as a tape feeder, a bulk feeder, and a tray feeder. When the electronic component 12 is a module or a land grid array (LGA) package, a tray feeder can be used to feed the electronic component 12. When the electronic component is a chip component, a tape feeder or a bulk feeder can be used.

Figure 3:
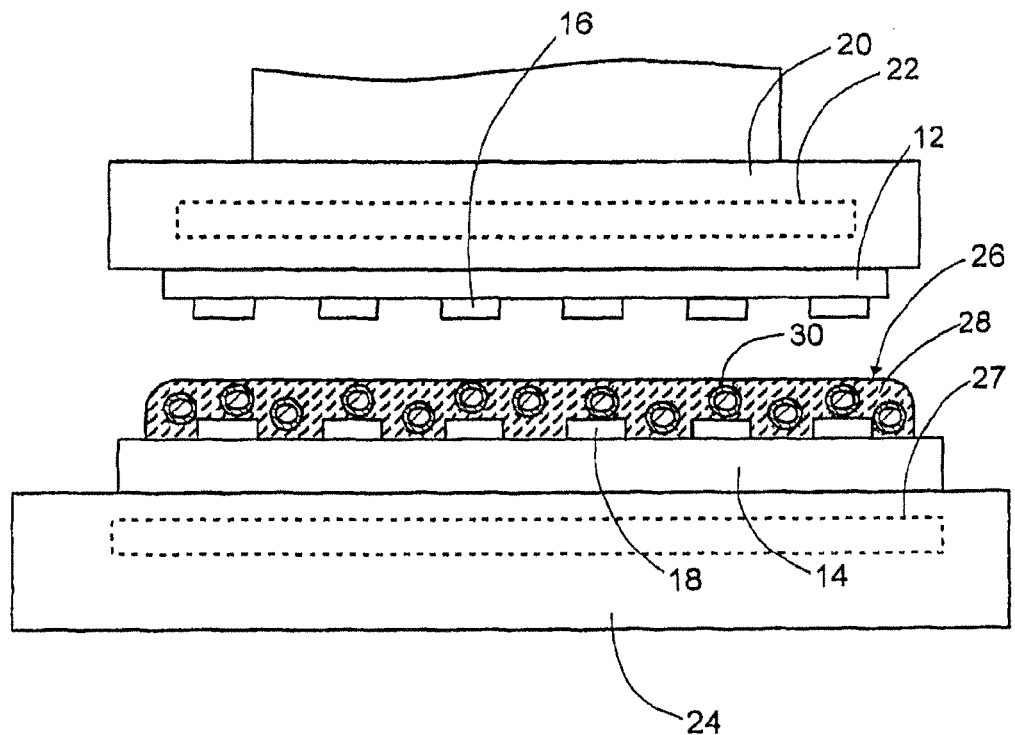
[FIG. 3] A partial cross-sectional view in a thermocompression-bonding and heating unit or a thermocompression-bonding unit immediately before the start of thermocompression bonding process.

As illustrated in FIG. 3, the thermocompression-bonding and heating unit 3 can include: a thermocompression head 20 for holding the electronic component 12 by, for example, suction; a press base 24 on which the substrate 14 is placed; a component recognition camera (not shown) for recognizing component electrodes 16, and a controller (not shown) for controlling the motion and operation of the thermocompression head 20. The thermocompression head 20 can include a heater 22 for heating the component electrodes 16. The press base 24 also can include a heater 27 for heating the land electrodes 18.

A description is given below of the solder-resin mixture, with reference to FIG. 3. As illustrated in FIG. 3, a solder-resin mixture 26 is prepared by mixing a particulate matter precursor 30 containing solder and an adhesive 28 containing a thermosetting resin together in a predetermined ratio, and dispersing them. The solder-resin mixture 26 may be in the form of paste or film. The solder-resin mixture 26 may be in the B stage. The B stage refers to an intermediate stage in the course of reaction of a thermosetting resin.

The adhesive 28 can be prepared by adding a curing agent, a thixotropic agent, a pigment, a coupling agent, and an activator to the thermosetting resin. The glass transition temperature of a cured product of the thermosetting resin is not particularly limited, but is preferably higher than the melting temperature of the solder contained in the particulate matter precursor 30 (e.g., 120 to 160° C.). The activator can be a material having an activation effect of removing oxides and other substances from the electrode surface and the bump surface in solder joining. Examples of such a material include organic acids and halogenated compounds.

Examples of the thermosetting resin to be contained in the adhesive 28 include, but not limited to, various resins such as epoxy resin, urethane resin, acrylic resin, polyimide resin, polyamide resin, bismaleimide, phenolic resin, polyester resin, silicone resin, and oxetane resin. One of them may be used alone, or two or more of them may be used in combination. Particularly preferred among them is epoxy resin because it is excellent in heat resistance and other properties.

The epoxy resin can be selected from the group consisting of bisphenol-type epoxy resins, multifunctional epoxy resins, flexible epoxy resins, brominated epoxy resins, glycidyl ester-type epoxy resins, and polymer-type epoxy resins. For example, bisphenol A-type epoxy resin, bisphenol F-type epoxy resin, bisphenol S-type epoxy resin, biphenyl-type epoxy resin, naphthalene-type epoxy resin, phenol novolac-type epoxy resin, and cresol novolac-type epoxy resin can be preferably used. The epoxy resin may be a modified product thereof. These may be used alone or in combination of two or more.

The curing agent to be used in combination with the thermosetting resin may be a compound selected from the group consisting of thiol compounds, modified amine compounds, multifunctional phenolic compounds, imidazole compounds, and acid anhydride compounds. These may be used alone or in combination of two or more.

Examples of the solder (second metal) to be contained in the particulate matter precursor 30 include, but not limited to, Sn—Bi alloy, Sn—Ag—Cu alloy, Sn—Bi—Ag alloy, Sn—Cu alloy, Sn—Sb alloy, Sn—Ag alloy, Sn—Ag—Cu—Bi alloy, Sn—Ag—Bi—In alloy, Sn—Ag—Cu—Sb alloy, Sn—Zn alloy, and Sn—Zn—Bi alloy. Examples other than the above Sn-containing solders include gold solders. In any case, the solder to be contained in the particulate matter precursor 30 preferably has a melting point of 110 to 240° C.

FIG. 4 illustrates a cross section of an example of the particulate matter precursor. The particulate matter precursor 30 illustrated in the figure has a spherical core 32 formed of a first metal (e.g., Cu or a Cu alloy) having a comparatively high melting temperature (e.g., 1000° C. or more), and a solder layer 34 containing a second metal (solder or a solder alloy) and covering the surface of the core 32.

A description is given below of a production method of a component-mounted structure of FIG. 2.

Figure 5:
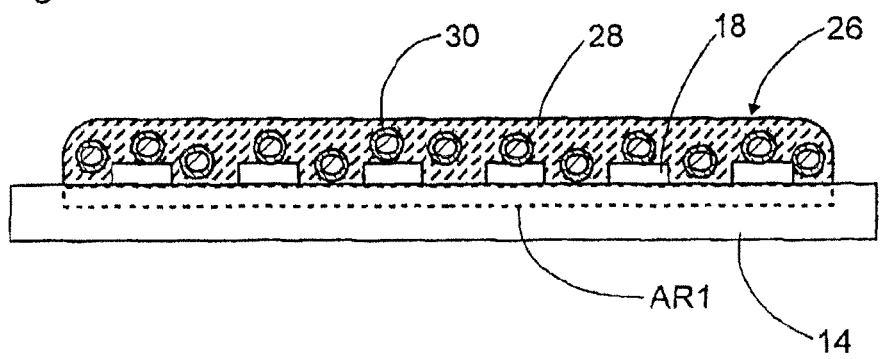
[FIG. 5] A partial cross-sectional view illustrating that the solder-resin mixture has been supplied onto substrate electrodes by a mixture supply unit.

First, as illustrated in FIG. 5, the solder-resin mixture 26 is supplied by the mixture supply unit 2 onto the substrate 14 supplied by the substrate supply unit 1, at the mounting region AR1 where the electronic component 12 is to be mounted. The mounting region AR1 includes all the land electrodes 18 to be joined with the component electrodes 16 of the electronic component 12.

Next, as illustrated in FIG. 3, in the thermocompression-bonding and heating unit 3, the electronic component 12 fed by the electronic component feeder 6 is held by the thermocompression head 20. The thermocompression head 20 can be provided with a plurality of suction nozzles or holes for component suction, at the area to come in contact with the electronic component 12.

Figure 6:
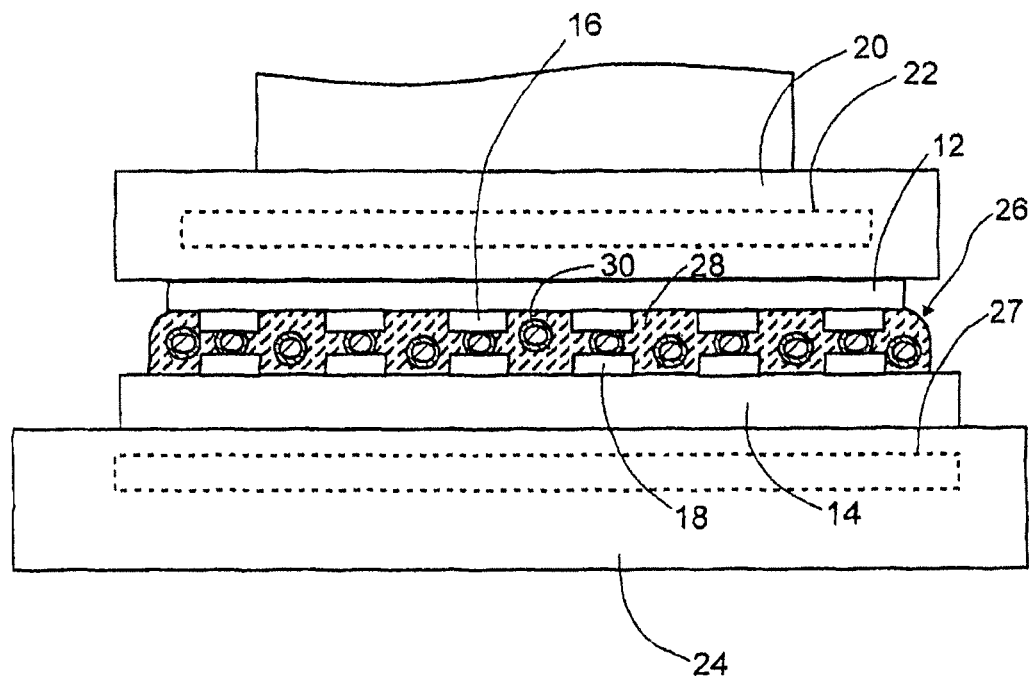
[FIG. 6] A partial cross-sectional view in the thermocompression-bonding and heating unit or the thermocompression bonding unit after the start of thermocompression bonding process.

Then, as illustrated in FIG. 6, positioning is performed, with reference to the images taken by the component recognition camera, such that the component electrodes 16 of the electronic component 12 respectively land on the corresponding land electrodes 18. Thereafter, the electronic component 12 is pressed against the substrate 14 at a predetermined pressure by the thermocompression head 20, while heated to a predetermined temperature (60° C.≤Ta≤250° C.) by the heater 22 provided in the thermocompression head 20.

Figure 7:
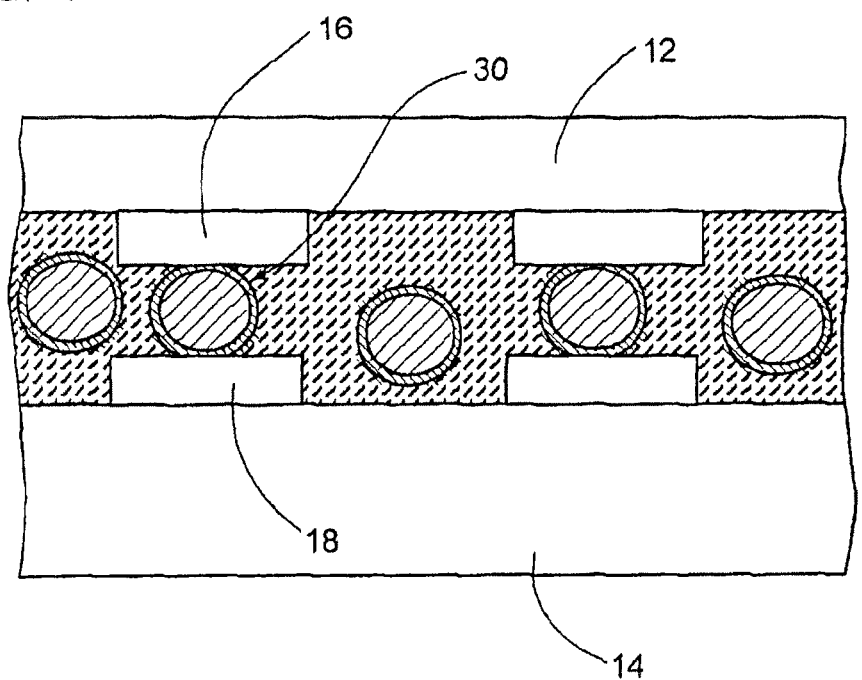
[FIG. 7] An enlarged partial cross-sectional view of an essential part of FIG. 6.

In that way, as illustrated in FIG. 7, the particulate matter precursor 30 becomes sandwiched between each of the component electrodes 16 and the corresponding land electrode 18. In the figure, the particulate matter precursor 30 is sandwiched one by one between a pair of the component electrode 16 and the land electrode 18. This is not a limitation, and two or more particulate matter precursors 30 can be sandwiched between a pair of the component electrode 16 and the land electrode 18.

Figure 8:
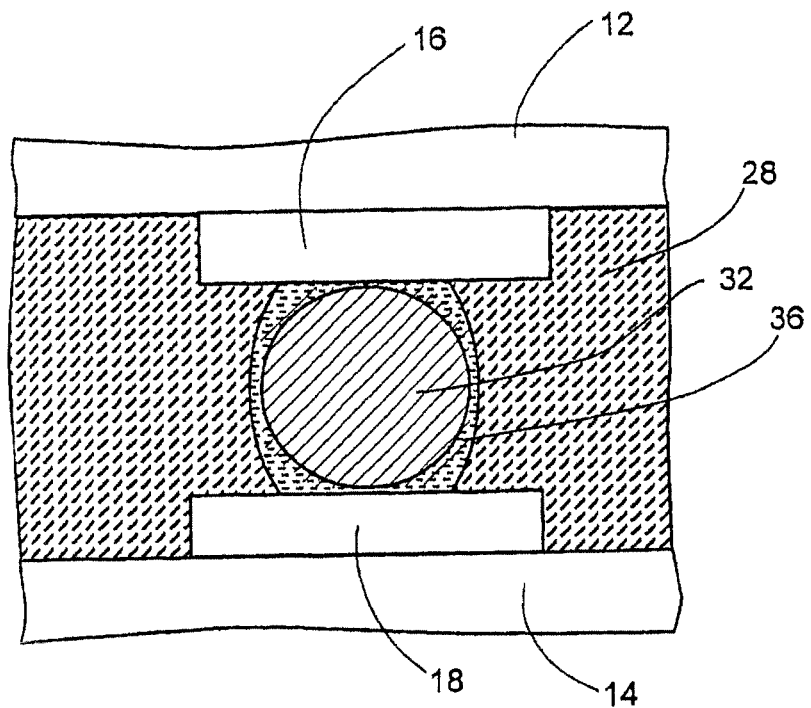
[FIG. 8] A partial cross-sectional view, taken after FIG. 7, illustrating that a solder layer has been melted.

Next, the state illustrated in FIG. 7 is held for a predetermined period of time Ma (e.g., 5 seconds), so that the second metal (solder) contained in the solder layer 34 melts into a molten solder 36, as illustrated in FIG. 8. Due to the oxide film removal effect of the activator contained in the adhesive 28, the molten solder 36 spreads over the surfaces of the component electrode 16 and the land electrode 18, and becomes elliptic in shape.

Figure 9:
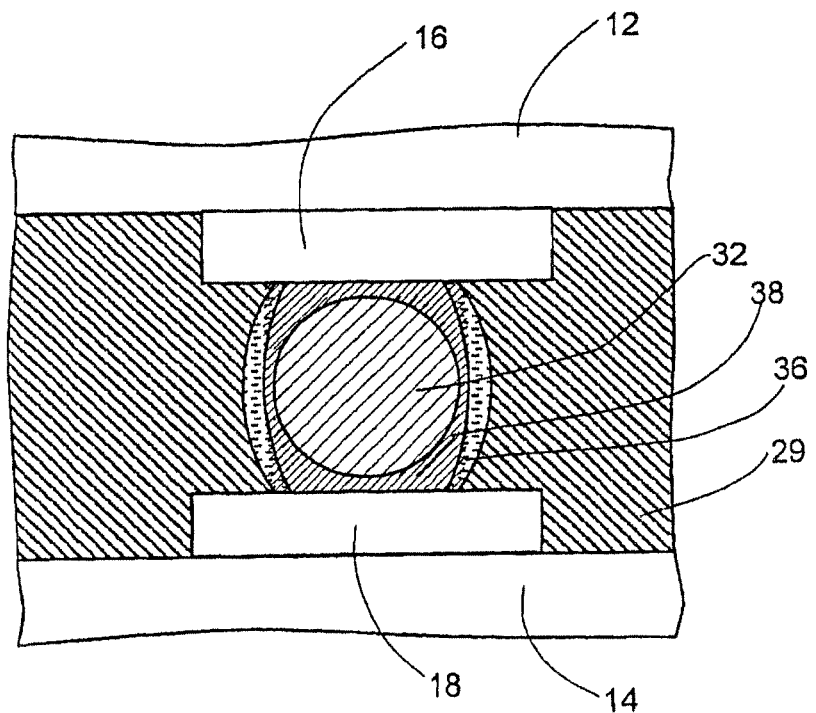
[FIG. 9] A partial cross-sectional view, taken after FIG. 8, illustrating that an intermetallic compound has been formed.

Subsequently, in the state illustrated in FIG. 8, heating is continued at a predetermined temperature Tb (300° C.≥Tb≥100° C.) for a predetermined period of time Mb (600 sec≥Mb≥1 sec) in the thermocompression-bonding and heating unit 3. As a result, the first metal (Cu) contained in the core 32 diffuses into the molten solder 36, forming an intermetallic compound layer 38 containing a solid-phase intermetallic compound having a melting point higher than that of the original solder, around the core 32, as illustrated in FIG. 9 (melting point shift acceleration process).

Concurrently therewith, the thermosetting resin contained in the adhesive 28 is cured by heating, forming the resin-reinforcing portion 29. When the component electrode 16 and the land electrode 18 contain Cu or a Cu alloy, the Cu contained in those electrodes also diffuses into the molten solder 36. Consequently, as illustrated in FIG. 9, the intermetallic compound layer 38 becomes thicker at portions near the component electrode 16 and the land electrode 18 than at portions away from them.

Subsequent cooling allows the molten solder 36 to cure into a solid solder 40 as illustrated in 10A, completing the joint portion 17. In the case where all the molten solder 36 is formed into an intermetallic compound with Cu, flash of solder from the joint portion 17 can be more effectively suppressed when the component-mounted structure is re-heated. In this case, only the intermetallic compound layer 38 is present around the core 32, and the layer of the solid solder 40 is not present.

Figure 10A:
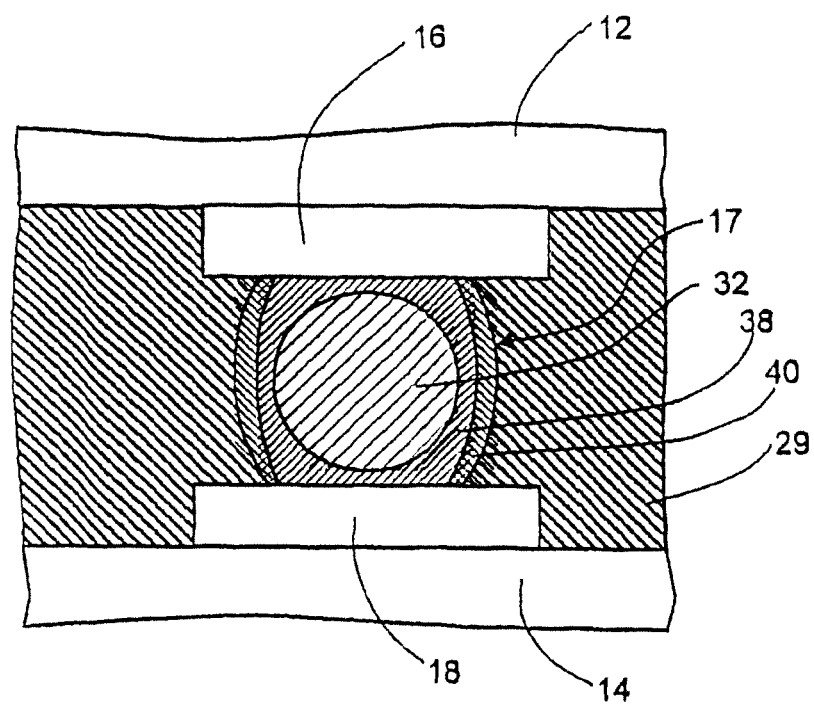
[FIG. 10A] A partial cross-sectional view, taken after FIG. 9, illustrating that the molten solder has been solidified, completing the formation of a joint portion.
Figure 10B:
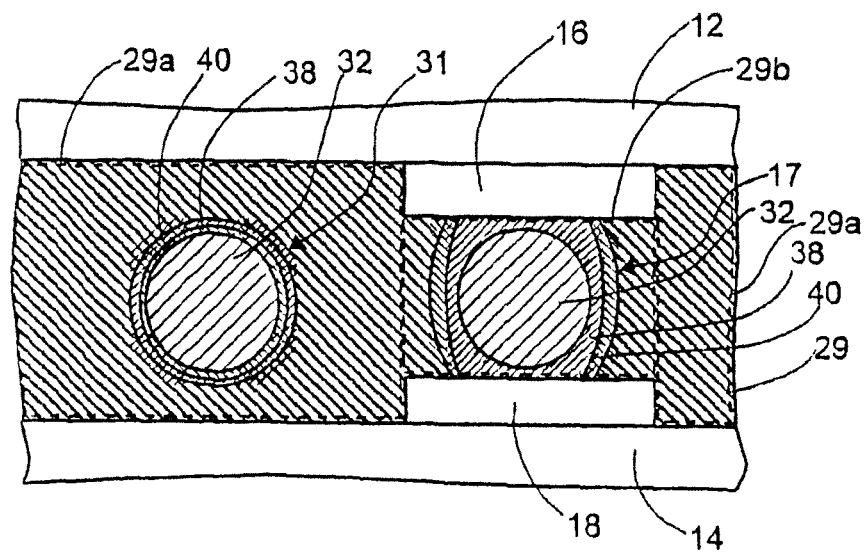
[FIG. 10B] A partial cross-sectional view illustrating another portion included in a resin-reinforcing portion of FIG. 10A.

As illustrated in FIG. 10B, in a portion (second portion 29a) not sandwiched between the corresponding electrodes of the resin-reinforcing portion 29, a particulate matter 31 including the intermetallic compound layer 38 is formed by heating the particulate matter precursor 30. On the other hand, in a first portion 29b between the corresponding electrodes of the resin-reinforcing portion 29, the joint portion 17 is formed. The particulate matter 31 includes the core 32 containing the first metal, the intermetallic compound layer 38 of the first and second metals, and the solder layer composed of the solid solder 40. Note that, in the particulate matter 31 also, all the molten solder 36 may be formed into an intermetallic compound, with no solid solder 40 left therein.

As described above, in Embodiment 1, the solder-resin mixture 26 includes the adhesive 28 and the particulate matter precursor 30 having the spherical core 32, most of which is composed of Cu, and the solder layer 34 provided on the surface of the core. The solder-resin mixture 26 is supplied onto the land electrodes 18 of the substrate 14, and the component electrodes 16 are joined to the land electrodes 18 by thermocompression bonding. As a result, the contact area between the solder and the Cu is increased, which facilitates the formation of an intermetallic compound of solder and Cu. Therefore, even though the Cu content in the solder-resin mixture 26 is reduced, a sufficient amount of intermetallic compound can be formed, and the re-melting temperature of the joint portion 17 can be easily increased to a desired temperature. This enables to prevent the molten solder from spreading to the adjacent electrodes via the Cu particles contained in a large amount in the solder-resin mixture 26, and thus to prevent a short circuit between the electrodes.

When the solid solder 40 exists as illustrated in FIGS. 10A and 10B, the joint portion 17 becomes multilayered, in which stress applied from outside, such as impact due to drop, tends to disperse among the layers. As a result, the joint portion 17 becomes hard to break. Moreover, stress applied from outside tends to disperse only within the solid solder 40 as the outermost layer, and even if the layer cracks, the crack is confined within the solid solder 40 and unlikely to reach as far as the intermetallic compound layer 38. Therefore, the electrical and mechanical connection of the joint portion 17 can be easily ensured. On the other hand, when no solid solder 40 exists in the joint portion 17, the joint portion 17 includes only the first metal core 32 and the intermetallic compound layer 38. As a result, the re-melting temperature of the joint portion 17 as a whole can be raised.

Figure 18:
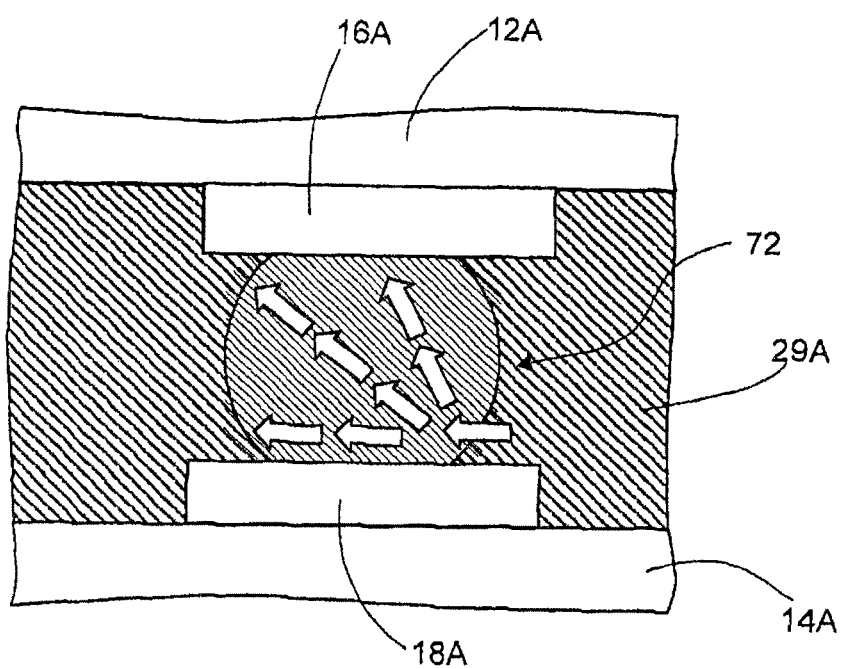
[FIG. 18] An enlarged partial cross-sectional view of the conventional component-mounted structure for explaining another problem of conventional component-mounted structures produced by conventional component-mounting system and method.

In contrast, as illustrated in FIG. 18, in a conventional solder joint portion 72 composed of solder alone, for example, when one point of the solder joint portion 72 is broken due to stress applied from outside, cracks spread from the point throughout the homogeneous solder joint portion 72 as shown by the arrows in the figure, fracturing the solder joint portion 72. In contrast, in the component-mounted structure of Embodiment 1, an excellent impact resistance can be obtained, and excellent connection reliability can be ensured. In addition, by including the particulate matter precursor 30 in the solder-resin mixture 26 in a specific amount within the range of 0.1 to 10 vol %, a short circuit between adjacent electrodes can be prevented.

Next, Embodiment 2 of the present invention is described.

Embodiment 2

FIG. 11A is a partial cross-sectional view of a component-mounted structure according to the present embodiment. FIG. 11B is a cross-sectional view of a particulate matter precursor used in producing the component-mounted structure according to the present embodiment A particulate matter precursor 30A illustrated in the figure is similar to the particulate matter precursor 30 of Embodiment 1 in that the precursor 30A has a core 32A and a solder layer 34A covering the surface of the core 32A. In the particulate matter precursor 30A, the core 32A includes a spherical resin particle 42 and a metal layer 44 covering the surface of the resin particle 42. The material of the resin particle 42 is not particularly limited, but is preferably a highly heat resistant resin having high elastic modulus (e.g., divinylbenzene cross-linked polymer, a cured product of various thermosetting resins, cross-linked polyester). The metal layer 44 can contain the first metal similar to that of Embodiment 1 (Cu or a Cu alloy having a melting point of 1000° C. or more). The adhesive contained in the solder-resin mixture of Embodiment 2 may be the adhesive 28 of Embodiment 1. The amount of the particulate matter precursor 30A may be set similarly to that in Embodiment 1.

The particulate matter precursor 30A, like the particulate matter precursor 30, preferably has a diameter of 2 to 100 µm. The solder layer 34A, like the solder layer 34, preferably has a thickness of 0.1 to 10 µm. The composition of the solder layer 34A may be similar to that of the solder layer 34. The diameter of the resin particle 42 may be 1 to 90 µm. The average thickness of the metal layer 44 may be 0.1 to 5 µm. The component mounting method and system using the solder-resin mixture including the particulate matter precursor 30A for mounting the electronic component 12 onto the substrate 14 are similar to those in Embodiment 1.

In the component-mounted structure produced by using the particulate matter precursor 30A, the resin-reinforcing portion 29 has the first portion 29*b* in which a joint portion 17A is formed between the corresponding electrodes. The joint portion 17A includes the metal layer 44 covering the surface of the spherical resin particle 42, an intermetallic compound layer 38A covering the surface of the metal layer 44, and a solid solder 40A on the outside thereof. The thickness of the metal layer 44 is smaller than that of the original metal layer 44 in the particulate matter precursor 30A. There is a case where all the first metal contained in the metal layer 44 in the particulate matter precursor 30A has been converted into an intermetallic compound, and the joint portion 17A does not include the metal layer 44. In this case, the resin particle 42 is in direct contact with the intermetallic compound layer 38A. There is another case where all the second metal contained in the solder layer 34A in the particulate matter precursor 30A has been converted into an intermetallic compound, and the joint portion 17A does not include the solid solder 40A.

In the second portion of the resin-reinforcing portion 29, a particulate matter 31A is formed by heating the particulate matter precursor 30A. The particulate matter 31A includes the resin particle 42, the metal layer 44 containing the first metal, the intermetallic compound layer 38A of the first and second metals, and a solder layer composed of the solid solder 40A. There is a case where the first metal has been sufficiently diffused into the molten solder, and the metal layer 44 has disappeared from the particulate matter 31A. Likewise, there is a case where all the second metal contained in the solder layer 34A in the particulate matter precursor 30A has converted into an intermetallic compound, and the particulate matter 31A has no solid solder 40A.

As described above, by including the resin particle 42 in the core 32A, the first metal can be used in a smaller amount, and the cost can be easily reduced. Moreover, by composing the resin particle 42 of a material which is stiff to some extent, the resin particle 42 sandwiched between the corresponding electrodes is unlikely to be crushed when joining the electrodes to each other by thermocompression bonding. In that way, the gap between the corresponding electrodes can be easily kept as desired, and the electronic component 12 can be easily connected to the substrate 14 with an electrical transmission line length set as designed.

Next, Embodiment 3 of the present invention is described.

Embodiment 3

Figure 12:
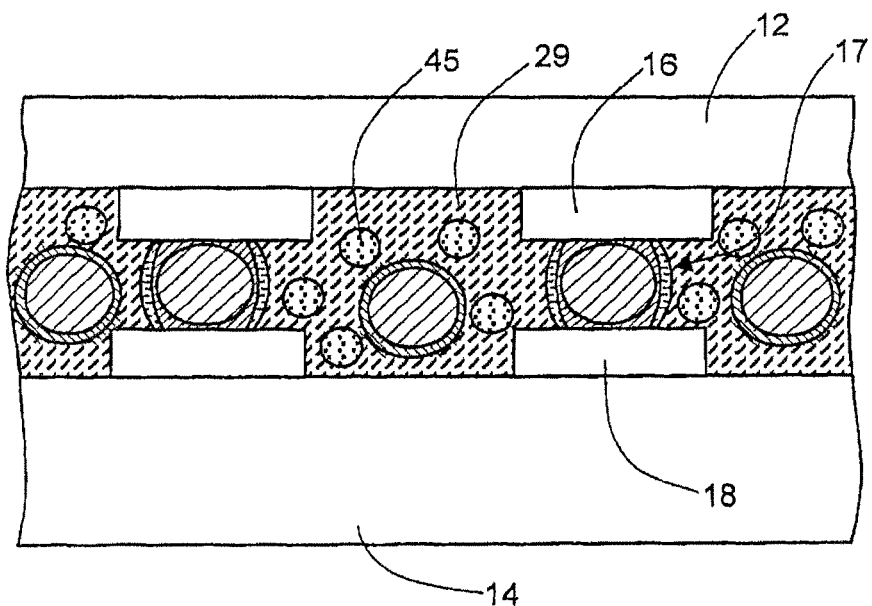
[FIG. 12] An enlarged partial cross-sectional view of an essential part of a component-mounted structure according to still another embodiment of the present invention.

FIG. 12 is an enlarged view of an essential part of a component-mounted structure of the present embodiment. In the component-mounted structure of Embodiment 3, the resin-reinforcing portion 29 includes an inorganic filler such as silica ($SiO_2$) and alumina. The component-mounted structure of the present embodiment can be produced by using a solder-resin mixture including such an inorganic filler. Except the above, the component-mounted structure of the present embodiment can be produced by the same component mounting method and system as those in Embodiments 1 and 2.

By producing as above, the resin-reinforcing portion 29 can include an inorganic filler 45 such as silica ($SiO_2$) and alumina as illustrated in FIG. 12. As a result, the coefficient of thermal expansion of the resin-reinforcing portion 29 can be lowered, while the modulus of elasticity thereof can be increased. In that way, the deterioration of the resin-reinforcing portion 29 such as cracks can be suppressed, even though the component-mounted structure is subjected to a heat cycle in which the component-mounted structure is heated and then cooled. Furthermore, the impact resistance of the resin-reinforcing portion 29 can be improved. Moreover, the moisture absorptivity of the resin-reinforcing portion 29 can be lowered, and thus the corrosion of the electrodes and wires can be prevented. Here, the amount of the inorganic filler 45, relative to the whole solder-resin mixture including the inorganic filler 45, is preferably 10 to 50 vol %.

Figure 13:
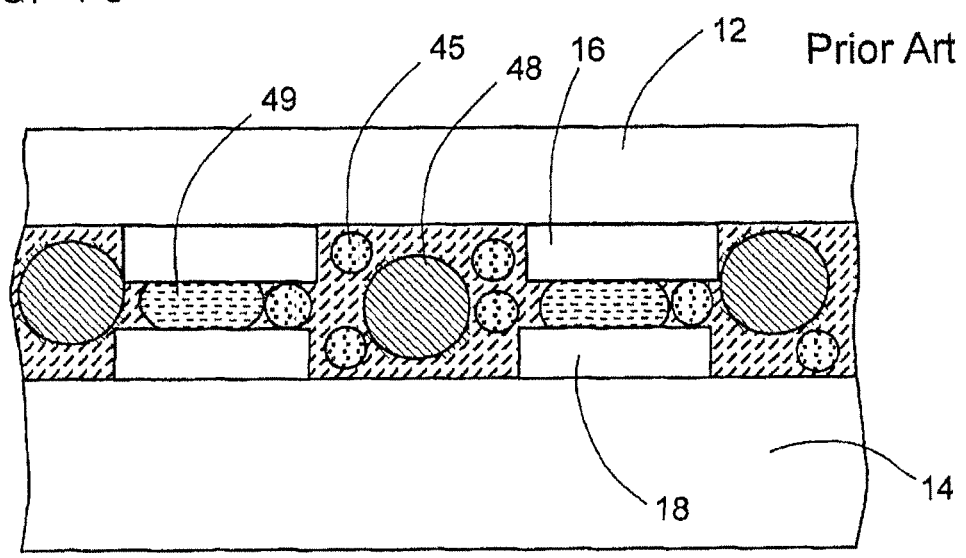
[FIG. 13] An enlarged partial cross-sectional view illustrating a conventional component-mounted structure, in process of production, corresponding to the component-mounted structure of FIG. 12.

A diameter Dk of the inorganic filler 45 is set smaller than a diameter Dr of the particulate matter precursor 30 (Dk<Dr). For example, 2 µm≥Dk≥0.1 µm. Note that if a simple solder particle 48 is used in place of the particulate matter precursor 30 or 30A as shown in FIG. 13, the solder particle 48, due to the absence of the core therein, will collapse boundlessly when it melts. As a result, the inorganic filler 45 becomes sandwiched between the component electrode 16 and the land electrode 18, and the electrodes may fail to be wetted with the molten solder 49. This is detrimental to the connection reliability. According to the component mounting method of Embodiment 3, by setting the diameter Dk of the inorganic filler 45 to be smaller than the diameter Dr of the particulate matter precursor 30, and using a particulate matter precursor including the core 32 or core 32A, the inorganic filler 45 is prevented from becoming sandwiched between the component electrode 16 and the land electrode 18. Therefore, the above-mentioned inconvenience can be prevented.

Embodiment 4

Figure 14:
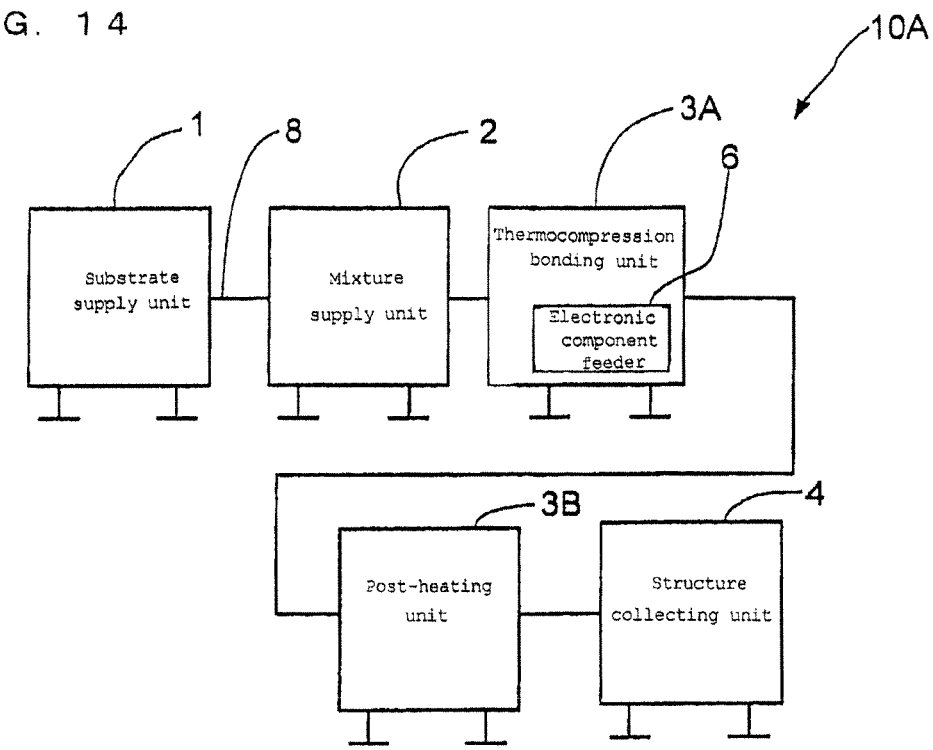
[FIG. 14] A block diagram schematically illustrating another example of a component-mounting system for producing a component-mounted structure of the present invention.

FIG. 14 is a block diagram of a surface mount line which is another example of a component-mounting system for producing a component-mounted structure of the present invention. A line 10A illustrated in the figure, like the line 10 of Embodiment 1, is a surface mount line for mounting the electronic component 12, which is a module including a flexible substrate with a component such as a semiconductor chip mounted thereon, onto the rigid or flexible substrate 14 corresponding to a printed circuit board of an electronic device. The line 10A is similar to the line 10 of Embodiment 1 in that the line 10A includes the substrate supply unit 1 for supplying the substrate 14 on the line, the mixture supply unit 2 for supplying a solder-resin mixture onto the land electrodes 18 serving as the electrodes of the substrate 14, and the structure collecting unit 4.

The line 10A differs from the line 10 in that the line 10A includes a thermocompression bonding unit 3A in place of the thermocompression-bonding and heating unit 3, and further includes a post-heating unit 3B disposed between the thermocompression bonding unit 3A and the structure collecting unit 4. In the following, a description will be given with focusing on the difference.

The thermocompression bonding unit 3A performs only the thermocompression bonding process as illustrated in FIGS. 7 and 8, and does not perform the melting point-shift acceleration process as illustrated in FIG. 9. Heating for the melting point-shift acceleration process is carried out in the post-heating unit 3B.

Figure 15:
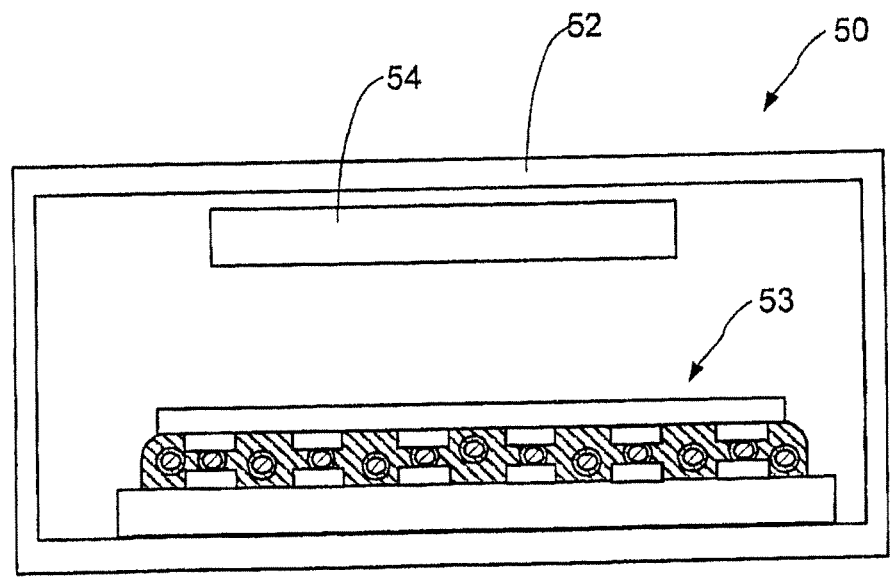
[FIG. 15] A partial cross-sectional view of an example of a post-heating unit included in the component-mounting system of FIG. 14.
Figure 16:
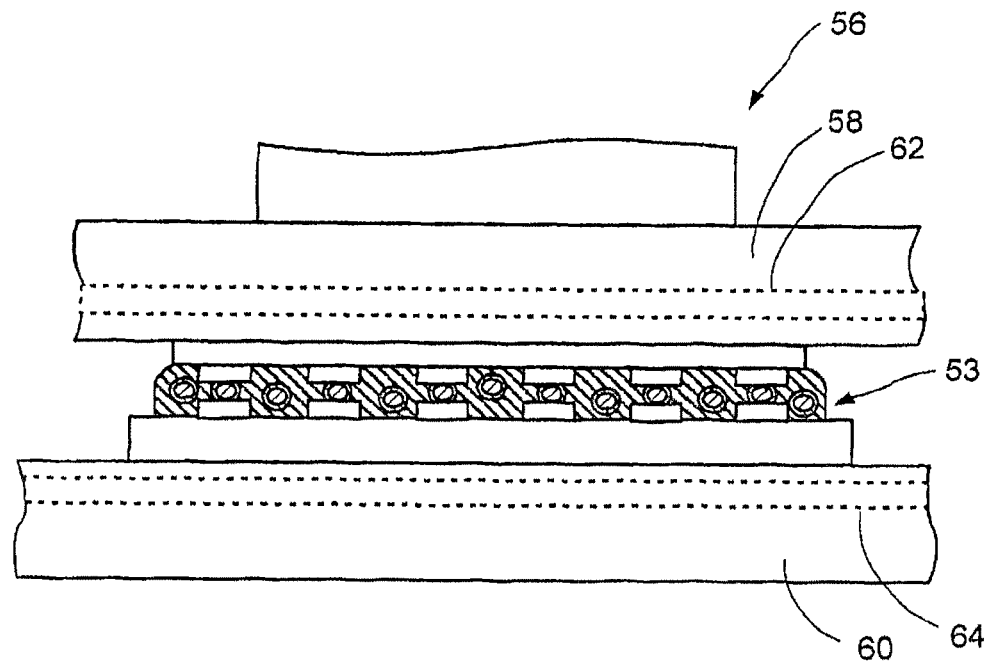
[FIG. 16] A partial cross-sectional view of another example of the post-heating unit included in the component-mounting system of FIG. 14.

FIGS. 15 and 16 illustrate examples of the post-heating unit. In the example of FIG. 15, the post-heating unit 3B has an oven 50. The oven 50 includes a container 52 for containing the electronic component 12 and the substrate 14 having been subjected to thermal compression bonding and joined to each other (hereinafter referred to as "structure precursor", or simply as "precursor"). The oven 50 further includes a heater 54 for heating the joint portion of a precursor 53 placed in the container 52, so as to facilitate inter-diffusion between the first metal included in the core 32 or core 32A and the molten solder 36. The container 52 is preferably capable of containing a plurality of the precursors 53 so that a plurality of the precursors 53 can be simultaneously subjected to the melting point-shift acceleration process. Therefore, when the melting point-shift acceleration process takes a longer time to complete than the thermocompression process, this will not cause the line tact time to be prolonged. Thus the production efficiency can be improved. The temperature and time of heating the joint portion 17 in the oven 50 are similar to those in Embodiments 1 to 3.

As described above, by installing the post-heating unit 3B independently from the thermocompression bonding unit 3A, the melting point-shift acceleration process can be performed in the post-heating unit 3B, while the thermocompression bonding process is performed in the thermocompression bonding unit 3A. This can shorten the line tact time, and improve the production efficiency.

In the example of FIG. 16, the post-heating unit 3B includes a press machine 56. The press machine 56 includes a press plate 58 and a press base 60. At least one of the press plate 58 and the press base 60 can include a heater 62 or 64. To simultaneously subject a plurality of the precursors 53 to the melting point-shift acceleration process, the shape and area of the press base 60 are preferably such that a plurality of the precursors 53 can be placed thereon. Likewise, the shape and area of the press plate 58 are preferably such that a plurality of the electronic components 12 can be simultaneously pressed against the substrate 14. Therefore, when the melting point-shift acceleration process takes a longer time to complete than the thermocompression process, this will not cause the line tact time to be prolonged. Thus the production efficiency can be improved.

INDUSTRIAL APPLICABILITY

According to the present invention, when a plurality of first electrodes of a first object and a plurality of second electrodes of a second object are solder-joined to each other by thermocompression bonding, and the joint portion is reinforced with resin, it is possible to sufficiently raise the re-melting temperature of the joint portion, and prevent a short circuit between adjacent electrodes. Therefore, the present invention is useful for producing a portable electronic device for which miniaturization is expected.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE SIGNS LIST

1: Substrate supply unit, 2: Mixture supply unit, 3A: Thermocompression bonding unit, 3B: Post-heating unit, 4: Structure collecting unit, 6: Electronic component feeder, 8: Conveyer, 10, 10A: Line, 12: Electronic component, 14: Substrate, 16: Component electrode, 17: Joint portion, 18: Land electrode, 20: Thermocompression head, 22, 27, 54, 62, 64: heater, 24, 60: Press base, 26: Resin mixture, 28: Adhesive, 29: Resin-reinforcing portion, 3: Thermocompression-bonding and heating unit, 30, 30A: Particulate matter precursor, 31, 31A: Particulate matter, 32, 32A: Core, 34, 34A: Solder layer, 36: Molten solder, 38, 38A: Intermetallic compound, 40, 40A: Solid solder, 42: Resin particle, 44: Metal layer, 45: Inorganic filler, 50: Oven, 52: Container, 53: Precursor, 56: Press machine, 58: Press plate, :Press base

The invention claimed is:

1. A component-mounted structure comprising:
a first object having a plurality of first electrodes,
a second object as an electronic component, the second object having second electrodes respectively corresponding to the plurality of first electrodes,
a joint portion joining the first electrodes and the corresponding second electrodes to each other, and
a resin-reinforcing portion covering at least part of the joint portion, wherein:
the joint portion includes a first core and a first intermetallic compound layer covering a surface of the first core, the first intermetallic compound layer including an intermetallic compound of a first metal and a second metal having a melting point lower than the first metal, the first core being made of the first metal,
the resin-reinforcing portion includes a first portion existing between the first electrodes and the second electrodes, and a second portion other than the first portion,
the second portion includes a particulate matter which has a second core and a second intermetallic compound layer, the second core being made of the first metal, the second intermetallic compound layer including the intermetallic compound of the first metal and the second metal,
an amount of the particulate matter included in the second portion being 0.1 to 10 vol %,
a melting point of the first intermetallic compound and a melting point of the second intermetallic compound are higher than a melting point of the second metal,
the first core contacts with at least one of the first electrodes and at least one of the second electrodes via the first intermetallic compound layer,
the joint portion further includes a first solder layer covering a surface of the first intermetallic compound layer and including the second metal, and
the second metal is an alloy including at least one selected from the group consisting of Sn, Pb, Ag, Zn, Bi, In, Cu, and Sb.

2. The component-mounted structure according to claim 1, wherein the particulate matter further includes a second solder layer covering a surface of the second intermetallic compound layer and including the second metal.

3. The component-mounted structure according to claim 1, wherein the first metal is Cu or a Cu alloy.

4. The component-mounted structure according to claim 1, wherein the resin-reinforcing portion further includes an inorganic filler being smaller in average particle size than the particulate matter.

5. The component-mounted structure according to claim 1, wherein the first object and the second object both include a flexible substrate.

6. The component-mounted structure according to claim 1, wherein the second object includes a flexible substrate, and the first object includes a rigid substrate.

7. The component-mounted structure according to claim 1, wherein the second object includes a semiconductor chip, and the first object includes a flexible substrate or a rigid substrate.

8. The component-mounted structure according to claim 1, wherein the first object and the second object both include a semiconductor chip.

9. The component-mounted structure according to claim 1, wherein the first intermetallic compound layer at portions near the first electrode and the second electrode is thicker than at portions away from the first electrode and the second electrode.

10. The component-mounted structure according to claim 1, wherein the intermetallic compound includes Cu and at least one selected from the group consisting of Pb, Ag, Zn, Bi, In and Sb.

11. The component-mounted structure according to claim 1, wherein the joint portion further includes a solder layer made of the second metal disposed on the first intermetallic compound layer.

12. The component-mounted structure according to claim 11, wherein the first core contacts with at least one of the first electrodes and at least one of the second electrodes via the first intermetallic compound layer without interposing the solder layer.

13. A component-mounted structure comprising:
a first object having a plurality of first electrodes,
a second object as an electronic component, the second object having second electrodes respectively corresponding to the plurality of first electrodes,
a joint portion joining the first electrodes and the corresponding second electrodes to each other, and
a resin-reinforcing portion covering at least part of the joint portion, wherein:
the joint portion includes a first resin core, a first metallic layer covering a surface of the first resin core and a first intermetallic compound layer covering a surface of the first metallic layer, the first intermetallic compound layer including an intermetallic compound of a first metal and a second metal having a melting point lower than the first metal, the first metallic layer being made of the first metal,
the resin-reinforcing portion includes a first portion existing between the first electrodes and the second electrodes, and a second portion other than the first portion,
the second portion includes a particulate matter which has a second resin core, a second metallic layer covering a surface of the second resin core and a second intermetallic compound layer, the second metallic layer being made of the first metal, the second intermetallic compound layer including the intermetallic compound of the first metal and the second metal,
an amount of the particulate matter included in the second portion being 0.1 to 10 vol %,
a melting point of the first intermetallic compound and a melting point of the second intermetallic compound are higher than a melting point of the second metal, the first metallic layer contacts with at least one of the first electrodes and at least one of the second electrodes via the first intermetallic compound layer, the joint portion further includes a solder layer made of the second metal disposed on the first intermetallic compound layer, and the intermetallic compound includes Cu and at least one selected from the group consisting of Pb, Ag, Zn, Bi, In and Sb.

14. The component-mounted structure according to claim 13, wherein the first core contacts with at least one of the first electrodes and at least one of the second electrodes via the first intermetallic compound layer without interposing the solder layer.

15. The component-mounted structure according to claim 13, wherein the first resin core is made of a divinylbenzene cross-linked polymer.

* * * * *